(12) United States Patent
Takebayashi

(10) Patent No.: US 10,292,209 B2
(45) Date of Patent: *May 14, 2019

(54) ELECTROSTATIC CHUCK HEATER

(71) Applicant: NGK INSULATORS, LTD., Nagoya (JP)

(72) Inventor: Hiroshi Takebayashi, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 70 days.

This patent is subject to a terminal disclaimer.

(21) Appl. No.: 15/618,328

(22) Filed: Jun. 9, 2017

(65) Prior Publication Data

US 2017/0280509 A1    Sep. 28, 2017

Related U.S. Application Data

(63) Continuation of application No. PCT/JP2016/068238, filed on Jun. 20, 2016.

(60) Provisional application No. 62/207,484, filed on Aug. 20, 2015.

(51) Int. Cl.
*H01T 23/00* (2006.01)
*H05B 3/28* (2006.01)
*H01L 21/683* (2006.01)
*H01L 21/67* (2006.01)

(52) U.S. Cl.
CPC ....... *H05B 3/286* (2013.01); *H01L 21/67103* (2013.01); *H01L 21/6831* (2013.01); *H01L 21/6833* (2013.01); *H05B 2203/016* (2013.01); *H05B 2203/017* (2013.01)

(58) Field of Classification Search
None
See application file for complete search history.

(56) References Cited

U.S. PATENT DOCUMENTS

| 9,343,346 | B2 * | 5/2016 | Kosakai ........... H01L 21/67103 |
| 2004/0206747 | A1 | 10/2004 | Ito |
| 2011/0092072 | A1 | 4/2011 | Singh et al. |
| 2013/0256297 | A1 | 10/2013 | Nobori et al. |

(Continued)

FOREIGN PATENT DOCUMENTS

| JP | 2002-134600 A1 | 5/2002 |
| JP | 2005-159018 A1 | 6/2005 |
| JP | 2010-040644 A1 | 2/2010 |

(Continued)

OTHER PUBLICATIONS

English translation of the International Preliminary Report on Patentability (Application No. PCT/JP2016/068238) dated Mar. 1, 2018.

(Continued)

*Primary Examiner* — Stephen W Jackson
(74) *Attorney, Agent, or Firm* — Burr & Brown, PLLC

(57) ABSTRACT

An electrostatic chuck heater 20 includes an electrostatic chuck 22, a sheet heater 30, and a support pedestal 60. The electrostatic chuck 22 is obtained by embedding an electrostatic electrode 24 in a ceramic sintered body 26. The sheet heater 30 is a resin sheet 32 having a plurality of correction heater electrodes 34 and a plurality of base heater electrodes 44. A first surface of the sheet heater 30 is resin-bonded to the electrostatic chuck 22, and a second surface of the sheet heater 30 is resin-bonded to the support pedestal 60 made of metal.

9 Claims, 4 Drawing Sheets

(56) References Cited

U.S. PATENT DOCUMENTS

2013/0277357 A1  10/2013  Tatsumi et al.
2015/0228513 A1   8/2015  Parkhe et al.

FOREIGN PATENT DOCUMENTS

| JP | 2013-508968 A1 | 3/2013 |
| JP | 2013-229310 A1 | 11/2013 |
| WO | 02/084717 A1 | 10/2002 |
| WO | 2012/090782 A1 | 7/2012 |

OTHER PUBLICATIONS

International Search Report and Written Opinion (Application No. PCT/JP2016/068238) dated Sep. 20, 2016.

\* cited by examiner

ELECTROSTATIC CHUCK HEATER

BACKGROUND OF THE INVENTION

1. Field of the Invention

The present invention relates to an electrostatic chuck heater.

2. Description of the Related Art

An electrostatic chuck heater is known, which is obtained by bonding a support pedestal made of metal, such as aluminum, to a substrate formed by embedding an electrostatic electrode and a heater electrode in a ceramic sintered body, with a bonding member interposed between the support pedestal and the substrate (see PTL 1). This electrostatic chuck heater is made by stacking a first compact printed with a heater electrode paste on one side, a second compact unprinted on both sides, and a third compact printed with an electrostatic electrode paste on one side, with the printed sides each sandwiched between adjacent compacts, and then calcining and hot-pressing the stacked compacts.

CITATION LIST

Patent Literature

PTL 1: JP 2013-229310 A

SUMMARY OF THE INVENTION

In the process of co-firing the stacked compacts including the electrostatic electrode and the heater electrode, the heater electrode may be deformed or the surface of the heater electrode may react with the surrounding components to cause changes in resistance value. As a result, it may not be possible to achieve high thermal uniformity.

The present invention has been made to solve the problems described above. A primary object of the present invention is to achieve high thermal uniformity.

An electrostatic chuck heater according to the present invention comprises an electrostatic chuck being a ceramic sintered body in which an electrostatic electrode is embedded;

a sheet heater being a resin sheet having one or a plurality of heater electrodes, the sheet heater having one surface resin-bonded to the electrostatic chuck; and a metal support pedestal resin-bonded to the other surface of the sheet heater.

In the electrostatic chuck heater described above, one surface of the sheet heater is resin-bonded to the ceramic sintered body, and the other surface of the sheet heater is resin-bonded to the support pedestal. The electrostatic chuck heater can thus be manufactured without exposing the one or plurality of heater electrodes to the firing temperature of the ceramic. Therefore, the one or plurality of heater electrodes are not deformed by heat and do not react with the surrounding components to cause changes in resistance value. The resistance value of the one or plurality of heater electrodes can thus be easily set to a target resistance value, and high thermal uniformity can be achieved.

In the electrostatic chuck heater according to the present invention, the sheet heater may have a first electrode area and a second electrode area at different heights, the first and second electrode areas being parallel to the surfaces of the sheet heater; the first electrode area may be an area where the plurality of heater electrodes are arranged; the second electrode area may be an area where a plurality of jumper wires configured to feed power to the respective heater electrodes are arranged; and a second end of each jumper wire may be located at a predetermined position on an outer periphery side of the sheet heater, the second end being opposite a first end of the jumper wire connected to a corresponding one of the heater electrodes. With this configuration, since the power supplied to each heater electrode can be individually controlled, it is easy to achieve high thermal uniformity. Note that the term "parallel" refers not only to being exactly parallel, but also refers to being substantially parallel, and this means that manufacturing errors and tolerances are allowed here.

In this case, the plurality of jumper wires may be electrically connected to a plurality of respective jumper lands arranged on the second surface of the sheet heater (i.e., the surface resin-bonded to the support pedestal); and the plurality jumper lands may face through holes arranged in the support pedestal. With this configuration, since the jumper lands are exposed from the back surface of the support pedestal, the jumper lands can be easily connected to an external power supply.

The plurality of jumper lands may be divided into a plurality of groups of two or more jumper lands; and the jumper lands belonging to each of the groups may face a common one of the through holes, and may be electrically connected to an external power supply through a flexible metal conductor assembly inserted in the through hole. Since this eliminates the need for preparing one metal wire for each of the jumper lands, the process of connecting the jumper lands to the external power supply can be simplified. Also, since the metal conductor assembly is flexible, the stress between the jumper lands and the metal conductor assembly can be absorbed by the metal conductor assembly.

The sheet heater may further have a third electrode area at a height different from the heights of the first and second electrode areas, the third electrode area being parallel to the first and second electrode areas, and the third electrode area may be an area where a common ground electrode electrically connected to the plurality of heater electrodes is disposed. This eliminates the need for routing the wires of the ground electrode. The ground electrode may be electrically connected to ground lands on the second surface of the sheet heater (i.e., the surface resin-bonded to the support pedestal). When the plurality of jumper lands are divided into a plurality of groups, the ground lands each may correspond to the through hole facing the jumper lands belonging to each group. In this case, the ground land may be electrically connected to the external power supply using the metal conductor assembly connected to the jumper lands.

The sheet heater may further have a fourth electrode area at a height different from the heights of the first and second electrode areas, the fourth electrode area being parallel to the first and second electrode areas, and the fourth electrode area may be an area where one or more base heater electrodes higher in output than the heater electrodes are arranged. With this configuration, the one or more high-output base heater electrodes can raise the temperature of the entire electrostatic chuck heater, whereas the low-output heater electrodes can finely control the thermal uniformity which cannot be ensured by the one or more base heater electrodes.

In this case, the first electrode area, the second electrode area, the third electrode area, and the fourth electrode area are preferably arranged in this order from one surface (i.e., the surface resin-bonded to the electrostatic chuck) toward the second surface of the sheet heater. With this configuration, the second electrode area having the jumper wires and the third electrode area having the ground electrode each serve as a heat diffusing layer that diffuses heat of the one or more base heater electrodes in the planar direction. This improves thermal uniformity of a wafer mounted on the electrostatic chuck. Additionally, since the heater electrodes are disposed near the electrostatic chuck, the heater electrodes can regulate the temperature with a higher resolution and can finely control the thermal uniformity of the wafer.

In the electrostatic chuck heater according to the present invention, a bonding sheet may be used for the resin bonding of the electrostatic chuck to the sheet heater and for the resin bonding of the sheet heater to the support pedestal. Examples of the bonding sheet include a sheet obtained by forming acrylic or silicone resin layers on both surfaces of a core member, and a sheet made only of an epoxy resin.

DETAILED DESCRIPTION OF THE INVENTION

Figure 1:
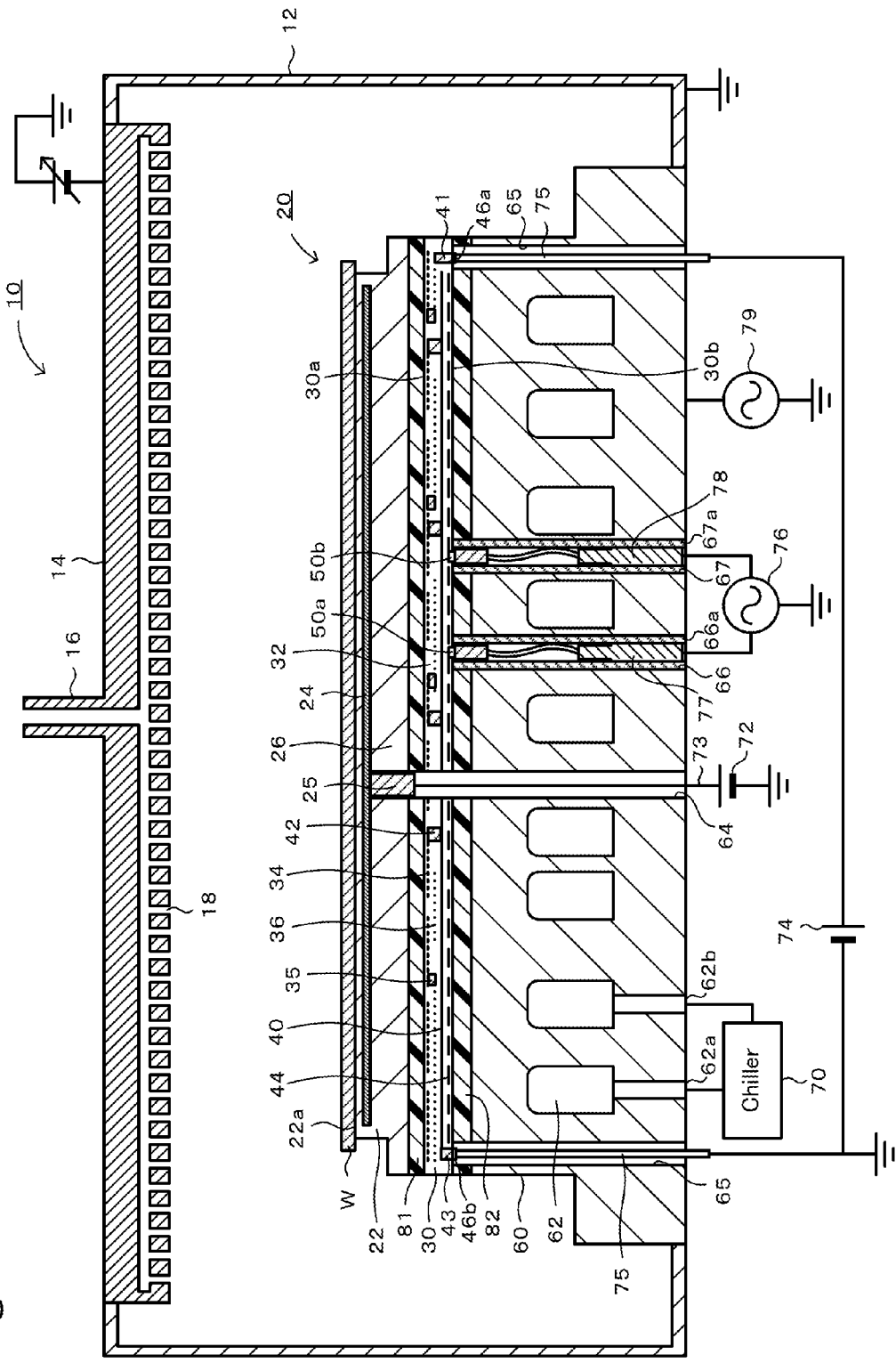
FIG. 1 is a cross-sectional view illustrating a general configuration of a plasma processing apparatus 10.
Figure 2:
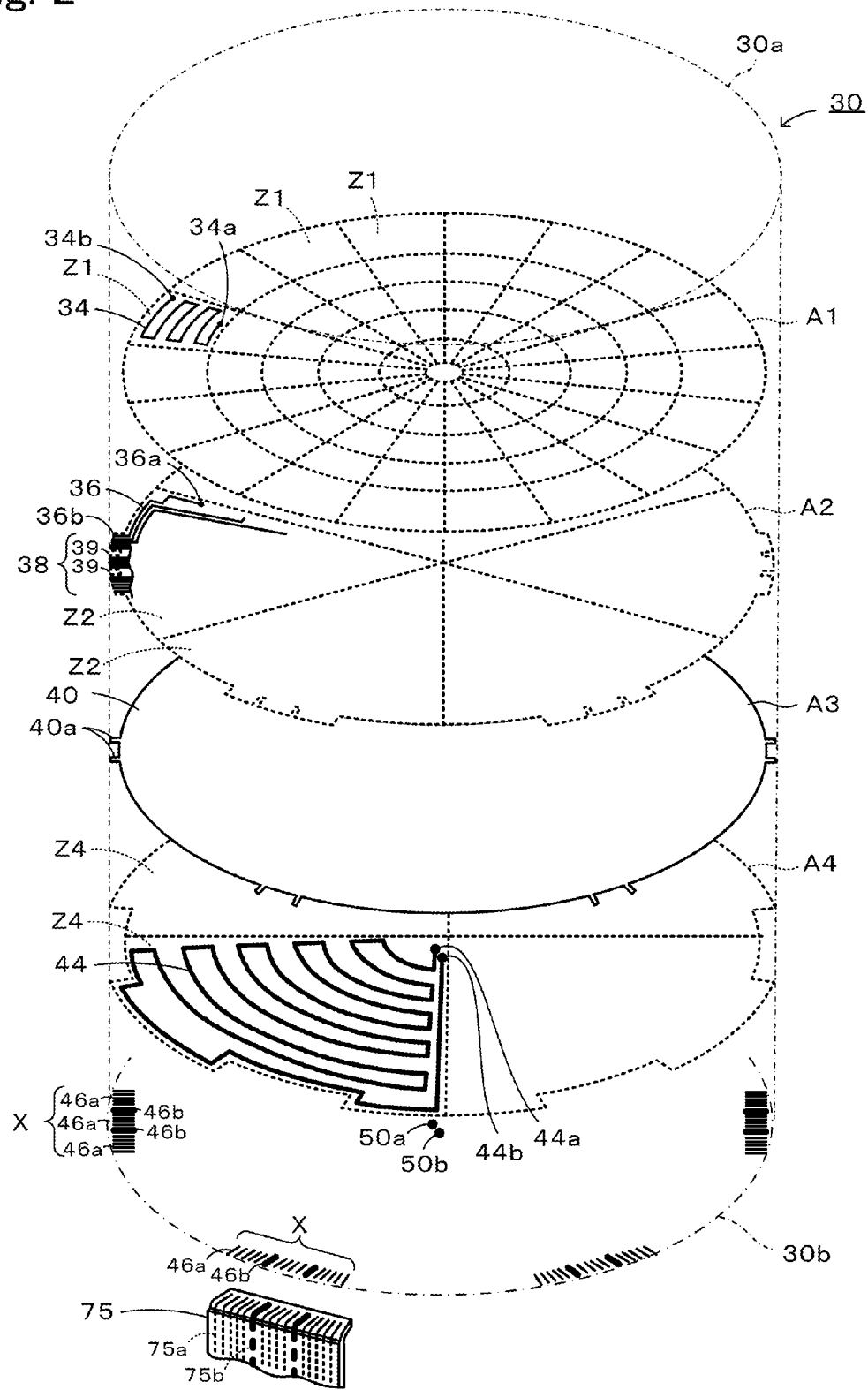
FIG. 2 is a perspective view illustrating an internal structure of a sheet heater 30.

Preferred embodiments of the present invention will now be described with reference to the drawings. FIG. 1 is a cross-sectional view illustrating a general configuration of a plasma processing apparatus 10. FIG. 2 is a perspective view illustrating an internal structure of a sheet heater 30.

As illustrated in FIG. 1, the plasma processing apparatus 10, which is a semiconductor manufacturing apparatus, includes a vacuum chamber 12, a shower head 14, and an electrostatic chuck heater 20. The vacuum chamber 12 is a box-shaped container formed of an aluminum alloy or the like. The shower head 14 is attached to a ceiling surface of the vacuum chamber 12. The shower head 14 allows process gas supplied through a gas introducing pipe 16 to be discharged through many gas injection holes 18 into the vacuum chamber 12. The shower head 14 serves as a cathode plate for plasma generation. The electrostatic chuck heater 20 is a device that draws and holds a wafer W onto a wafer mounting surface 22a. The electrostatic chuck heater 20 will now be described in detail.

The electrostatic chuck heater 20 includes an electrostatic chuck 22, a sheet heater 30, and a support pedestal 60. A lower surface of the electrostatic chuck 22 and an upper surface 30a of the sheet heater 30 are bonded to each other, with a first bonding sheet 81 interposed therebetween. An upper surface of the support pedestal 60 and a lower surface 30b of the sheet heater 30 are bonded to each other, with a second bonding sheet 82 interposed therebetween. Examples of the bonding sheets 81 and 82 include a sheet obtained by forming acrylic resin layers on both surfaces of a polypropylene core member, a sheet obtained by forming silicone resin layers on both surfaces of a polyimide core member, and a sheet made only of an epoxy resin.

The electrostatic chuck 22 is a disk-shaped member obtained by embedding an electrostatic electrode 24 in a ceramic sintered body 26. Examples of the ceramic sintered body 26 include a sintered aluminum nitride body and a sintered alumina body. An upper surface of the electrostatic chuck 22 is the wafer mounting surface 22a for mounting the wafer W thereon. The thickness of the ceramic sintered body 26 is not particularly limited, but is preferably from 0.5 mm to 4 mm.

The sheet heater 30 is a disk-shaped member obtained by forming a plurality of correction heater electrodes 34, a plurality of jumper wires 36, a ground electrode 40, and a plurality of base heater electrodes 44 in a heat-resistant resin sheet 32. The resin sheet 32 is made, for example, of polyimide resin or liquid crystal polymer. The sheet heater 30 has a first electrode area A1 to a fourth electrode area A4 (see FIG. 2) at different heights, parallel to the upper surface 30a of the sheet heater 30.

The first electrode area A1 is divided into many zones Z1 (e.g., 100 zones or 300 zones). Each zone Z1 has the correction heater electrode 34 routed continuously from one end 34a to the other end 34b throughout the entire zone Z1. In FIG. 2, the first electrode area A1 is provided with imaginary lines indicated by dotted lines, and the zones Z1 are each defined by imaginary lines. Although FIG. 2 shows the correction heater electrode 34 in only one zone Z1 for convenience, the other zones Z1 also have the respective correction heater electrodes 34. The outline of the sheet heater 30 is indicated by a dot-and-dash line.

The second electrode area A2 has the jumper wires 36 configured to feed power to the respective correction heater electrodes 34. Accordingly, the number of the jumper wires 36 is the same as that of the correction heater electrodes 34. The second electrode area A2 is divided into zones Z2 (e.g., 6 zones or 8 zones) which are fewer than the zones Z1. In FIG. 2, the second electrode area A2 is provided with imaginary lines indicated by dotted lines, and the zones Z2 are each defined by imaginary lines. Although FIG. 2 shows part of the jumper wires 36 in only one zone Z2 for convenience, the other zones Z2 also have the jumper wires 36. In the present embodiment, a plurality of correction heater electrodes 34 within a region obtained by projecting one zone Z2 onto the first electrode area A1 are described as those belonging to the same group. The one end 34a of each of the correction heater electrodes 34 belonging to one group is connected to one end 36a of the corresponding jumper wire 36 within the zone Z2 corresponding to the one group, through a via 35 (see FIG. 1) vertically extending from the first electrode area A1 to the second electrode area A2. The other end 36b of the jumper wire 36 is extended to an outer edge region 38 of the zone Z2. As a result, the other ends 36b of the jumper wires 36 connected to the correction heater electrodes 34 belonging to the same group are all positioned within one outer edge region 38. In a region X obtained by projecting the outer edge region 38 onto the lower surface 30b of the sheet heater 30, a plurality of jumper lands 46a each connected through a via 41 (see FIG. 1) to the second end 36b of the corresponding one of the jumper wires 36 are arranged. In other words, the plurality of jumper lands 46a are arranged in groups of two or more in the same region X to be exposed to the outside. Note that the resistivity of the correction heater electrodes 34 is preferably greater than or equal to that of the jumper wires 36.

The third electrode area A3 has the ground electrode 40 common to the plurality of correction heater electrodes 34. Each correction heater electrode 34 is connected to the ground electrode 40 through a via 42 (see FIG. 1) extending from she first electrode area A1 through the second electrode area A2 to the third electrode area A3. The ground electrode 40 has protrusions 40a extending outward from the outer edge thereof. The protrusions 40a are located at positions facing respective notches 39 in each outer edge region 38. The protrusions 40a are each connected through a via 43 (see FIG. 1) to the corresponding one of ground lands 46b on the lower surface 30b of the sheet heater 30. The ground lands 46b are positioned together with the jumper lands 46a within the region X in the lower surface 30b of the sheet heater 30.

The fourth electrode area A4 is divided into zones Z4 (e.g., 4 zones or 6 zones) which are fewer in number than the total number of the correction heater electrodes 34 in the first electrode area A1. Each zone Z4 has the base heater electrode 44 routed continuously from one end 44a to the other end 44b throughout the entire zone Z4. In FIG. 2, the fourth electrode area A4 is provided with imaginary lines indicated by dotted lines, and the zones Z4 are each defined by imaginary lines. Although FIG. 2 shows the base heater electrode 44 in only one zone Z4 for convenience, the other zones Z4 also have the respective base heater electrodes 44. Both ends 44a and 44b of each base heater electrode 44 are connected, through a via (not shown) extending from the fourth electrode area A4 to the lower surface 30b of the sheet heater 30, to a pair of base lands 50a and 50b on the lower surface 30b of the sheet heater 30.

As illustrated in FIG. 1, the support pedestal 60 is a disk-shaped member made of metal, such as Al or Al alloy, and is internally provided with a refrigerant passage 62. A chiller 70 for regulating the temperature of a refrigerant is connected to an inlet 62a and an outlet 62b of the refrigerant passage 62. The refrigerant is supplied from the chiller 70 to the inlet 62a of the refrigerant passage 62, passes through the refrigerant passage 62 extending throughout the entire support pedestal 60, and is returned through the outlet 62b of the refrigerant passage 62 to the chiller 70. After being cooled to a set temperature in the chiller 70, the refrigerant is supplied again to the inlet 62a of the refrigerant passage 62. The support pedestal 60 has a plurality of types of through holes 64 to 67 vertically passing through the support pedestal 60. The through hole 64 is a hole for exposing a feed terminal 25 of the electrostatic electrode 24 to the outside. The through hole 65 is a bole for exposing a land group (jumper lands 46a and ground lands 46b, see FIG. 2) in each region X in the lower surface 30b of the sheet heater 30 to the outside. The through holes 66 and 67 are for exposing the base lands 50a and 50b, respectively, of each base heater electrode 44 to the outside. Electrical insulating tubes 66a and 67a are inserted in the through holes 66 and 67, respectively. Although not shown, the support pedestal 60 also has through holes and others for moving up and down lift pins for lifting the wafer W.

The plasma processing apparatus 10 further includes an electrostatic chuck power supply 72, a correction heater power supply 74, a base heater power supply 76, and an RF power supply 79. The electrostatic chuck power supply 72 is a direct-current power supply, which is connected to the feed terminal 25 of the electrostatic electrode 24 through a feed rod 73 inserted in the through hole 64. The correction heater power supply 74 is a direct-current power supply, which is connected to the jumper lands 46a and the ground lands 46b of the correction heater electrodes 34 through the connection flexible printed circuit boards (connection FPCs) 75 which are each a metal conductor assembly inserted in the corresponding through hole 65. Specifically, the jumper lands 46a and the ground lands 46b belonging to the same group, as in FIG. 2, are arranged in the same region X, and thus are connected through one connection FPC 75 to the correction heater power supply 74. The connection FPC 75 is a cable formed by binding metal conductors 75a and 75b, each coated with a resin film, into a band shape. The metal conductors 75a and 75b are exposed from an end portion of the connection FPC 75 facing the corresponding region The metal conductors 75a are conductors for connecting the jumper lands 46a to the positive electrode of the correction heater power supply 74, whereas the metal conductors 75b are conductors for connecting the ground lands 46b to the negative electrode of the correction heater power supply 74. The base heater power supply 76 is an alternating-current power supply, which is connected through the cable terminal 77 inserted in the corresponding through hole 66 to one base land 50a of the base heater electrode 44, and also connected through a cable terminal 78 inserted in the corresponding through hole 67 to the other base land 50b of the base heater electrode 44. The RF power supply 79 is a power supply for plasma generation, and is connected to the support pedestal 60 serving as an anode plate to supply high-frequency power to the support pedestal 60. The shower head 14 serving as a cathode plate is grounded through a variable resistor.

An application of the plasma processing apparatus 10 configured as described above will now be described. First, the wafer W is mounted on the wafer mounting surface 22a of the electrostatic chuck 22. After a vacuum pump reduces the pressure in the vacuum chamber 12 to a predetermined degree of vacuum, a direct-current voltage is applied to the electrostatic electrode 24 of the electrostatic chuck 22 to generate Coulomb force or Johnsen-Rahbek force, thereby drawing and securing the wafer W to the wafer mounting surface 22a of the electrostatic chuck 22. Next, the vacuum chamber 12 is filled with a process gas atmosphere of a predetermined pressure (e.g., several tens to several hundreds of Pa). In this state, a high-frequency voltage is applied between the shower head 14 and the support pedestal 60 to generate plasma. The surface of the wafer W is etched by the generated plasma. During the etching, a controller (not shown) performs control such that the temperature of the wafer W reaches a target temperature determined in advance. Specifically, the controller receives a detection signal from a temperature measuring sensor (not shown) that measures the temperature of the wafer W, and controls a current supplied to each of the base heater electrodes 44, a current supplied to each of the correction heater electrodes 34, and the temperature of the refrigerant circulated through the refrigerant passage 62 such that the measured temperature of the wafer W becomes equal to the target temperature. In particular, the controller finely controls the current supplied to each of the correction heater electrodes 34 so as to prevent the occurrence of temperature distribution over the wafer W. The temperature measuring sensor may be either embedded in the resin sheet 32 or bonded to the surface of the resin sheet 32.

A method for manufacturing the electrostatic chuck 22 will now be described. First, a disk member formed by a compact or sintered body of ceramic is prepared, and the electrostatic electrode 24 is formed on one surface of the disk member. The electrostatic electrode 24 may be formed by screen printing of an electrode paste, or by PVD, CVD, or plating. Next, a disk-shaped compact having the same diameter as the disk member is stacked on the surface of the disk member having the electrostatic electrode 24 formed thereon to form a laminated body. The laminated body is hot-pressed to obtain the ceramic sintered body 26 having the electrostatic electrode 24 embedded therein. The ceramic sintered body 26 is then processed into a desired shape and thickness by grinding, abrasive blasting, or the like. At the same time, a hole extending from the lower surface of the ceramic sintered body 26 to the electrostatic electrode 24 is formed. The feed terminal 25 integral with the feed rod 73 is inserted into the hole, and the feed terminal 25 and the electrostatic electrode 24 are brazed. The electrostatic chuck 22 is thus obtained.

Figure 3:
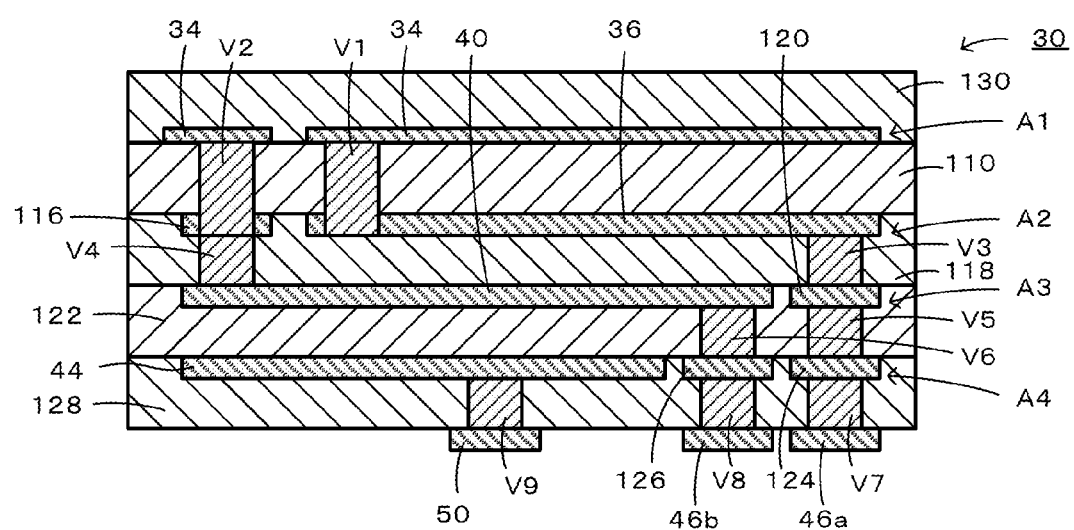
FIG. 3 is a schematic sectional view illustrating a part of the sheet heater 30.

A method for manufacturing the sheet heater 30 will now be described with reference to FIG. 3. The correction heater 34, the jumper wire 36, the ground electrode 40, the base heater 44, a land 116 disposed on the same layer as the jumper wire 36, a land 120 disposed on the same layer as the ground electrode 40, lands 124 and 126 disposed on the same layer as the base heater 44, and the jumper land 46a, the ground land 46b, and a base land 50 disposed on the surface to be bonded to the support pedestal 60 (see FIG. 1) are all formed by known photolithography. A resin layer 110 a resin layer 118, a resin layer 122, and a resin layer 128 for electrical insulation between electrodes formed on layers, and an uppermost resin layer 130 are formed by lamination. For example, a polyimide resin or liquid crystal polymer may be used to form each resin layer. A via V1 for electrically connecting the correction heater electrode 34 to the jumper wire 36, a via V2 for electrically connecting the correction heater electrode 34 to the land 116, a via V3 for electrically connecting the jumper wire 36 to the land 120, a via V4 for electrically connecting the land 116 to the ground electrode 40, a via V5 for electrically connecting the land 120 to the land 124, a via V6 for electrically connecting the ground electrode 40 to the land 126, a via V7 for electrically connecting the land 124 to the jumper land 46a, a via V8 for electrically connecting the land 126 to the ground land 46b, and a via V9 for electrically connecting the base heater 44 to the base land 50 are each formed by filling a through hole formed at a predetermined position in the corresponding resin layer with metal. The sheet heater 30 described above can be easily formed by a known method for manufacturing a multilayer printed circuit board.

Figure 4:
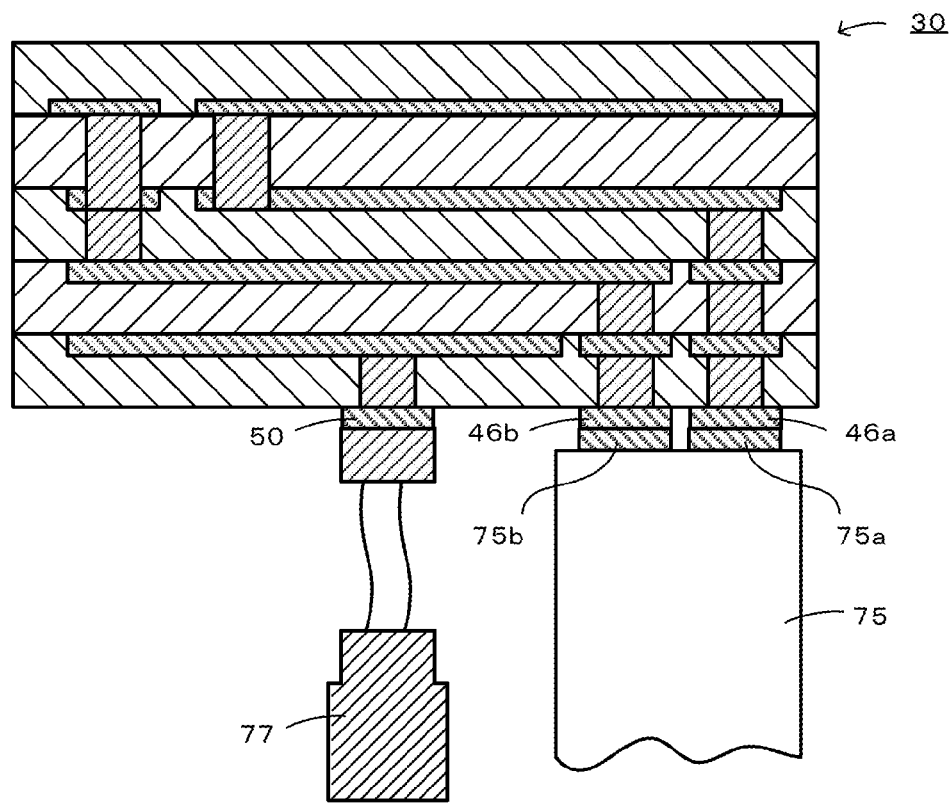
FIG. 4 is a schematic sectional view illustrating the state that a connection flexible printed circuit board 75 and a cable terminal 77 are attached to the sheet heater 30.

Then, the metal conductor 75a and the metal conductor 75b of the connection FPC 75 are soldered to the jumper land 46a and the ground land 46b, respectively, of the sheet heater 30, and the cable terminal 77 is soldered to the base land 50 (see FIG. 4). Next, the connection FPC 75 and the cable terminal 77 connected to the sheet heater 30 are inserted through the second bonding sheet 82 into the through hole 65 and the through hole 66, respectively, in the support pedestal 60. Also, the feed rod 73 of the electrostatic chuck 22 is inserted through the first bonding sheet 81 into the through hole 64 in the sheet heater 30 and the support pedestal 60. By application of heat and pressure in this state, the electrostatic chuck 22, the sheet heater 30, and the support pedestal 60 are bonded together, with the first and second bonding sheets 81 and 82 each interposed between adjacent components. The electrostatic chuck heater 20 is thus obtained.

In the electrostatic chuck heater 20 described above, one surface of the sheet heater 30 is resin-bonded to the electrostatic chuck 22, and the other surface of the sheet heater 30 is resin-bonded to the support pedestal 60. The electrostatic chuck heater 20 can thus be manufactured without exposing the correction heater electrodes 34 and the base heater electrodes 44 to the firing temperature of the ceramic. Therefore, the heater electrodes 34 and 44 are not deformed by heat and do not react with the surrounding components to cause changes in resistance value. The resistance values of the heater electrodes 34 and 44 can thus be easily set to target resistance values, and high thermal uniformity can be achieved.

The sheet heater 30 has the first electrode area A1 and the second electrode area A2 at different heights, parallel to the upper surface 30a of the sheet heater 30. The first electrode area A1 has the plurality of correction heater electrodes 34, and the second electrode area A2 has the plurality of jumper wires 36 for supplying power to the respective correction heater electrodes 34. Therefore, it is possible to individually control the power supplied to each correction heater electrode 34, and thus to easily achieve high thermal uniformity.

The jumper lands 46a for supplying power to the respective correction heater electrodes 34 are exposed from the back surface of the support pedestal 60. This facilitates connection of the jumper lands 46a to the correction heater power supply 74.

The plurality of jumper lands 46a are divided into groups of two or more jumper lands 46a. The jumper lands 46a belonging to the same group are arranged to face the common through hole 65 and are electrically connected to the correction heater power supply 74 through one connection FPC 75, which is flexible, inserted in the through hole 65. Therefore, there is no need to prepare one metal wire for each of the jumper lands 46a, and this simplifies the process of connecting the jumper lands 46a to the correction heater power supply 74. Also, since the connection FPC 75 is used, the stress between the jumper lands 46a and the connection FPC 75 can be absorbed by the connection FPC 75.

The third electrode area A3 of the sheet heater 30 has the ground electrode 40 common to the plurality of correction heater electrodes 34. This eliminates the need for routing the wires of the ground electrode 40.

The fourth electrode area A4 of the sheet heater 30 has the base heater electrodes 44 higher in output and fewer in number than the correction heater electrodes 34. Therefore, the high-output base heater electrodes 44 can raise the temperature of the entire wafer W, whereas the low-output correction heater electrodes 34 can finely control the thermal uniformity which cannot be ensured by the base heater electrodes 44.

The first electrode area A1, the second electrode area A2, the third electrode area A3, and the fourth electrode area A4 are arranged in this order from the upper surface 30a toward the lower surface 30b of the sheet heater 30. The second electrode area A2 having the jumper wires 36 and the third electrode area A3 having the ground electrode 40 each serve as a heat diffusing layer that diffuses heat of the base heater electrodes 44 in the planar direction. This improves thermal uniformity of the wafer W mounted on the electrostatic chuck 22. Additionally, since the correction heater electrodes 34 are disposed near the electrostatic chuck 22, the correction heater electrodes 34 can regulate the temperature with a higher resolution and can finely control the thermal uniformity of the wafer W.

The present invention is not limited to the above-described embodiments, and it will be appreciated that the present invention can be embodied in various forms so long as they are within the technological scope of the present invention.

For example, in the embodiment described above, the jumper land 46a and the ground land 46b are connected to the correction heater power supply 74 by soldering them to the metal conductor 75a and the metal conductor 75b of the connection FPC 75. However, the present invention is not particularly limited to this. For example, the jumper land 46a and the ground land 46b may be connected to the correction heater power supply 74 by bringing them into contact with contact pins embedded in the support pedestal 60, or by bringing them into contact with contact pins in a device (e.g., vacuum chamber 12) for mounting the electrostatic chuck heater 20.

In the embodiment described above, the sheet heater 30 has a structure in which the resin layer 130 is disposed on the correction heater electrodes 34. However, the resin layer 130 may be removed to expose the correction heater electrodes 34 to the upper surface 30a of the sheet heater 30. In this case, the first bonding sheet 81 is disposed to cover the correction heater electrodes 34. Although the resin layer 122 is disposed under the base heater electrodes 44, the resin layer 122 may be removed to expose the base heater electrodes 44 to the lower surface 30b of the sheet heater 30. In this case, the second bonding sheet 82 is disposed to cover the base heater electrodes 44.

Although the ground electrode 40 common to all the correction heater electrodes 34 is provided in the embodiment described above, the ground electrode 40 may be divided into two or more. In this case, the correction heater electrodes 34 may be divided into a plurality of groups, and the correction heater electrodes 34 belonging to each group may be connected to the ground electrode 40 corresponding to the group.

Although the sheet heater 30 including the correction heater electrodes 34 and the base heater electrodes 44 has been described as an example in the embodiment described above, the correction heater electrodes 34 may be removed, and the jumper wires 36 and the ground electrode may also be removed accordingly. In this case, since the plurality of base heater electrodes 44 can control the temperature on a zone-by-zone basis, thermal uniformity can be achieved with relatively high precision. Alternatively, the base heater electrodes 44 may be removed. In this case, since many correction heater electrodes 34 can finely control the temperature on a zone-by-zone basis, thermal uniformity can be achieved with high precision.

In the embodiment described above, the first electrode area A1 having the correction heater electrodes 34, the second electrode area A2 having the jumper wires 36, the third electrode area A3 having the ground electrode 40, and the fourth electrode area A4 having the base heater electrodes 44 are arranged in this order from the upper surface 30a toward the lower surface 30b of the sheet heater 30, but these areas may be arranged in different order. However, to expose the jumper lands 46a of the jumper wires 36 to the lower surface 30b, it is preferable that the jumper wires 36 be disposed immediately below the correction heater electrodes 34. Also, since disposing the base heater electrodes 44 above the correction heater electrodes 34 and the jumper wires 36 causes various problems, it is preferable that the base heater electrodes 44 be disposed below the correction heater electrodes 34 and the jumper wires 36. That is, the following problems will occur if the base heater electrodes 44 are disposed above the correction heater electrodes 34 and the jumper wires 36: (1) the base heater electrodes 44 serve as heat diffusing layer that diffuses heat of the correction heater electrodes 34 in the planar direction, and this makes it difficult for the correction heater electrodes 34 to finely regulate the temperature; (2) although it is necessary to create holes in the first and second electrode areas A1 and A2 to expose both the ends 44a and 44b of the base heater electrodes 44 to the lower surface 30b, since the correction heater electrodes 34 need to be designed to extend outside the holes, it is difficult to regulate the temperature around the holes; and (3) heat of the high-output base heater electrodes 44 cannot be easily removed downward toward the support pedestal 60.

Although the first to fourth electrode areas A1 to A4 are each provided in one layer in the embodiment described above, at least one of the first to fourth electrode areas A1 to A4 may be provided in multiple layers (multiple stages).

The present application claims priority from U.S. Provisional Application No. 62/207,484, filed on Aug. 20, 2015, the entire contents of which are incorporated herein by reference.

What is claimed is:

1. An electrostatic chuck heater comprising:
an electrostatic chuck being a ceramic sintered body in which an electrostatic electrode is embedded;
a sheet heater being a resin sheet having one or a plurality of heater electrodes, the sheet heater having one surface resin-bonded to the electrostatic chuck; and
a metal support pedestal resin-bonded to the other surface of the sheet heater.

2. The electrostatic chuck heater according to claim 1, wherein the sheet heater has a first electrode area and a second electrode area at different heights, the first and second electrode areas being parallel to the surfaces of the sheet heater; the first electrode area is an area where the plurality of heater electrodes are arranged; the second electrode area is an area where a plurality of jumper wires configured to feed power to the plurality of respective heater electrodes are arranged; one end of jumper wire is connected to a corresponding one of the heater electrodes; and the other end of the jumper wire is located at a predetermined position on an outer periphery side of the sheet heater.

3. The electrostatic chuck heater according to claim 2, wherein the plurality of jumper wires are electrically connected to a plurality of respective jumper lands arranged on the other surface of the sheet heater; and
the plurality jumper lands face through holes arranged in the support pedestal.

4. The electrostatic chuck heater according to claim 3, wherein the plurality of jumper lands are divided into a plurality of groups of two or more jumper lands; and
the jumper lands belonging to each of the groups face a common one of the through holes, and are electrically connected to an external power supply through a flexible metal conductor assembly inserted in the through hole.

5. The electrostatic chuck heater according to claim 2, wherein the sheet heater has a third electrode area at a height different from the heights of the first and second electrode areas, the third electrode area being parallel to the first and second electrode areas, and the third electrode area is an area where a common ground electrode electrically connected to the plurality of heater electrodes is arranged.

6. The electrostatic chuck heater according to claim 2, wherein the sheet heater has a fourth electrode area at a height different from the heights of the first and second electrode areas, the fourth electrode area being parallel to the first and second electrode areas, and the fourth electrode area is an area where one or more base heater electrodes higher in output than the heater electrodes are arranged.

7. The electrostatic chuck heater according to claim 5, wherein the sheet heater has a fourth electrode area at a height different from the heights of the first and second electrode areas, the fourth electrode area being parallel to the first and second electrode areas, and the fourth electrode area is an area where one or more base heater electrodes higher in output than the heater electrodes are arranged.

8. The electrostatic chuck heater according to claim 7, wherein the first electrode area, the second electrode area, the third electrode area, and the fourth electrode area are arranged in this order from the one surface toward the other surface of the sheet heater.

9. The electrostatic chuck heater according to claim 1, wherein a bonding sheet is used for the resin bonding of the electrostatic chuck to the sheet heater and for the resin bonding of the sheet heater to the support pedestal.

* * * * *